United States Patent
Prakash et al.

(10) Patent No.: US 10,725,681 B2
(45) Date of Patent: Jul. 28, 2020

(54) METHOD FOR CALIBRATING THE READ LATENCY OF A DDR DRAM MODULE

(71) Applicant: Synopsys, Inc., Mountain View, CA (US)

(72) Inventors: Gyan Prakash, Hatia Ranchi (IN); Nidhir Kumar, Bangalore (IN); Chandrashekar Narla, Karimnagar (IN); Praphul Malige, Bengaluru (IN)

(73) Assignee: Synopsys, Inc., Mountain View, CA (US)

( * ) Notice: Subject to any disclaimer, the term of this patent is extended or adjusted under 35 U.S.C. 154(b) by 39 days.

(21) Appl. No.: 15/573,921

(22) PCT Filed: Jun. 13, 2016

(86) PCT No.: PCT/IN2016/000152
§ 371 (c)(1),
(2) Date: Nov. 14, 2017

(87) PCT Pub. No.: WO2016/203490
PCT Pub. Date: Dec. 22, 2016

(65) Prior Publication Data
US 2018/0357002 A1    Dec. 13, 2018

(30) Foreign Application Priority Data

Jun. 16, 2015   (IN) ............................ 1278/CHE/2015

(51) Int. Cl.
*G06F 12/00*     (2006.01)
*G06F 3/06*      (2006.01)
(Continued)

(52) U.S. Cl.
CPC ......... *G06F 3/0632* (2013.01); *G06F 3/0611* (2013.01); *G06F 3/0673* (2013.01);
(Continued)

(58) Field of Classification Search
CPC ....................................................... G06F 12/00
(Continued)

(56) References Cited

U.S. PATENT DOCUMENTS 7,512,762 B2    3/2009   Gower et al.
8,856,579 B2    10/2014  Gower et al.
(Continued)

OTHER PUBLICATIONS

Intellectual Property India, Examination report under sections 12 & 13 of the Patents Act, IN Patent Application No. 1278/CHE/2015, dated Sep. 17, 2019, six pages.
(Continued)

*Primary Examiner* — Gautam Sain
(74) *Attorney, Agent, or Firm* — Fenwick & West LLP

(57) ABSTRACT

A method for automatic calibration of read latency of a memory module is envisaged. The read latency is initially set to a default maximum value. The default maximum value is equivalent to the number of clock cycles required to complete a data read operation. A data pattern to be read from the memory module in consideration of the default maximum value is identified. A memory read operation is preformed, and a first data pattern is captured, in accordance with the default maximum value. The identified data pattern is compared with the first data pattern, and the default maximum value is iteratively calibrated based on the comparison thereof. Aforementioned steps are repeated across a plurality of memory read operations, and variations ire the maximum default value are tracked, and an average maximum value is calculated based thereupon. The average maximum value is assigned as the read latency for the memory module.

7 Claims, 3 Drawing Sheets

(51) Int. Cl.
  *G11C 29/02* (2006.01)
  *G11C 11/4063* (2006.01)
  *G11C 11/401* (2006.01)
  *G11C 29/50* (2006.01)

(52) U.S. Cl.
  CPC .......... *G06F 12/00* (2013.01); *G11C 11/4063* (2013.01); *G11C 29/023* (2013.01); *G11C 29/028* (2013.01); *G11C 11/401* (2013.01); *G11C 29/50012* (2013.01)

(58) Field of Classification Search
  USPC ........................................................ 711/105
  See application file for complete search history.

(56) References Cited

U.S. PATENT DOCUMENTS

| | | | | |
|---|---|---|---|---|
| 2002/0184461 | A1* | 12/2002 | Zumkehr | G06F 13/4239 711/167 |
| 2008/0209095 | A1* | 8/2008 | Allen | G06F 13/1689 710/118 |
| 2009/0150636 | A1 | 6/2009 | Gower et al. | |
| 2009/0240968 | A1* | 9/2009 | Kizer | G06F 13/1689 713/401 |
| 2010/0185810 | A1* | 7/2010 | Cline | G06F 13/161 711/105 |
| 2012/0290800 | A1* | 11/2012 | Krishnan | G06F 13/1689 711/159 |

OTHER PUBLICATIONS

PCT International Search Report and Written Opinion, PCT Application No. PCT/IN2016/000152, dated Jan. 13, 2017, eight pages.

\* cited by examiner

METHOD FOR CALIBRATING THE READ LATENCY OF A DDR DRAM MODULE

CROSS REFERENCE TO RELATED APPLICATIONS

This Patent Application is a National Phase Application corresponding to the PCT Application No. PCT/IN2016/000152 filed on Jun. 13, 2016 with the title "A METHOD FOR CALIBRATING THE READ LATENCY OF A DDR DRAM MODULE". This Patent Application claims the priority of the Indian Provisional Patent Application No. 1278/CHE/2015 filed on Jun. 16, 2015 with the title "A SYSTEM AND METHOD FOR AUTO-CALIBRATING READ LATENCY FOR DDR DRAM SYSTEM", the contents of which is included herein by the way of reference.

BACKGROUND

Technical Field

The present disclosure relates to the field of integrated circuits. Particularly, the present disclosure relates to latency management in DDR DRAM (Double Data Rate Dynamic Random Access Memory) systems. More particularly, the present disclosure relates to automation of latency management in DDR DRAM systems.

Description of the Related Art

Typically, systems with an SOC (System on Chip) design rely upon DDR DRAM modules for implementation of data intensive operations. DDR DRAM modules are commonly used with such systems for providing a comparatively better bandwidth in terms of data storage and the speed of data accessibility. Whenever any data is written into a DDR DRAM memory module (referred to as 'memory module' hereafter) and whenever any (stored) data is read from the memory module, read/write latency is inherently associated with the data write/data read operation. The latency is typically defined as the time taken for the data to be transferred from the CPU of a system with SOC design to the memory module and vice-versa. The latency of a memory module is influenced by a plurality of factors including internal temperature, voltage and clock frequency.

In view of the foregoing, there has always been felt a need for calibrating the latency of a memory module, in order to achieve comparatively better efficiency in terms data transfer to and from the memory module. Several attempts have been made by prior art systems and methods towards calibrating the latency of a memory module, and one such attempt teaches calibrating the latency, and especially the read latency of a memory module based on an anticipated output time window. In this case the output time window was hypothesized based on a predetermined maximum latency value and a predetermined minimum latency value. However, one of the drawbacks associated with calibrating latency in the aforementioned manner was that it would result in the anticipation of minimum and maximum latency values, which in turn might not be the optimum values necessary for achieving an efficient data transfer between the CPU (of the system with SOC design) and the memory module.

Hence, the need for a system/method that accurately calibrates the latency and especially the read latency of a memory module keeping in view the operational efficiency of the memory module has been imminent.

OBJECTS

An object of the present disclosure is to provide a system and method for automatic calibration of latency in a memory module.

Yet another object of the present disclosure is to provide a system and method that efficiently compensates for voltage and temperature fluctuations of the SoC over a given time period.

Still a further object of the present disclosure is to provide a system and method that takes into account the memory system drift, while calculating the corresponding read latency.

One more object of the present disclosure is to provide a system and method that accurately calibrates the read latency of a memory module.

Yet another object of the present disclosure is to provide a system and method that accurately determines the direction in which the read latency of the memory module is to be calibrated.

One more object of the present disclosure is to provide a system and method that calculates an optimal read latency value for a memory module.

SUMMARY

The present disclosure envisages a method for automatic calibration of read latency of a memory module. In accordance with the present disclosure, the read latency is initially set to a default maximum value. The default maximum value assigned to the read latency is preferably equivalent to the number of clock cycles required to accomplish a data read operation.

Subsequently, a data pattern that could be read from the memory module as a result of a memory read operation and in consideration to the default maximum value is identified (referred to as 'identified data pattern'). Subsequently, a memory read operation is preformed, and the corresponding data pattern is captured, in accordance with the 'default maximum value' (preset read latency). The captured data pattern is termed as the 'first data pattern'. Subsequently, the first data pattern is compared with the 'identified data pattern', and the default maximum value (read latency) is iteratively calibrated. The aforementioned steps are repeated across a plurality of memory read operations, and any variations in the 'maximum default value' are tracked, and an 'average maximum value' is calculated based thereupon. Subsequently, the 'average maximum value' is assigned as the read latency for the memory module.

Subsequently, at least 'three' instances of the 'average maximum value' are derived, by the way of firstly incrementing the 'average maximum value' and secondly decrementing the 'average maximum value' and thirdly by taking into consideration the 'average maximum value' as it is. The 'three' instances of the 'average maximum value' represent predetermined number of clock cycles. A plurality of memory read operations (preferably 'three') are performed based on the three instances of the 'average maximum value', and the data patterns read from the memory module are recorded. The recorded data patterns are compared with one another, and based on the resultant of the comparison, a decision regarding the recalibration of read latency is undertaken.

BRIEF DESCRIPTION OF THE DRAWINGS

The other objects, features and advantages will be apparent to those skilled in the art from the following description and the accompanying drawings in which.

DETAILED DESCRIPTION

Figure 1:
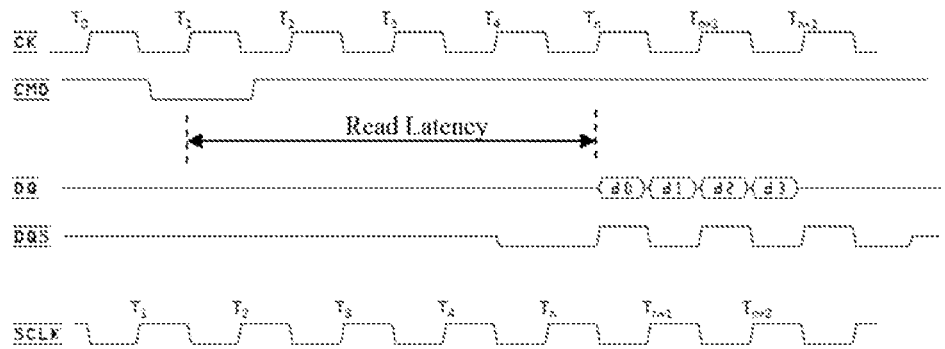
FIG. 1 is a timing diagram illustrating the read latency associated with a memory module.

A typical (DRAM) memory read operation is performed by transmitting a 'read' command targeting a specific row, column, bank group and bank of the memory module. Subsequently, the memory module returns the data signal (DQ) along with the read data strobe (DQS). Typically, the data signal (DQ) and the data strobe signal (DQS) are aligned with one another post the occurrence of DRAM read latency (as shown in FIG. 1). Read latency is the time interval between when the command is sent to the memory module and when read data reflected in the CPU of a system incorporating the memory module. As shown in FIG. 1, DRAM read command is issued at time instance $T_1$ and read data is available at $T_n$. The time interval between $T_1$ to $T_n$ is termed the read latency of DRAM.

Figure 2:
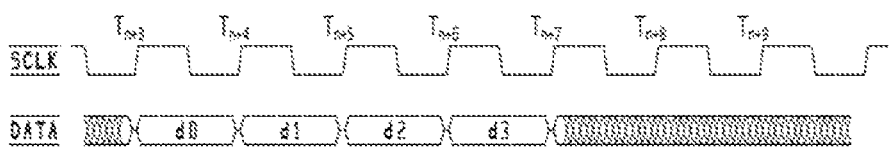
FIG. 2 is a timing diagram illustrating the scenario when the read latency for the memory module is at a minimum possible value.
Figure 3:
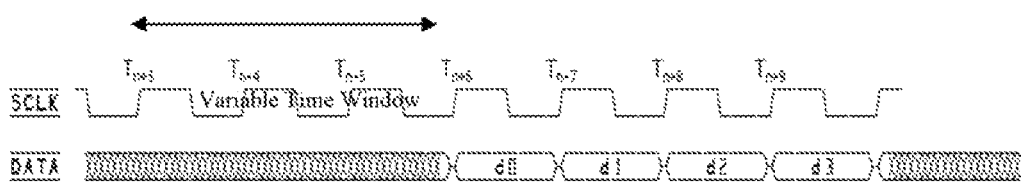
FIG. 3 is a timing diagram illustrating the scenario when the read latency for the memory module is at a maximum possible value.

The factors influencing the read latency include hoard delay effects on command and data path, clock domain crossing, variations in voltage and temperature. Referring to FIG. 2 and FIG. 3, there are shown timing diagrams illustrating how the prior art systems/methods anticipate the read latency to be a 'minimum value' and a 'maximum value' respectively. As shown in FIG. 2, when the read latency is equated to a 'minimum value', captured data is available at a memory controller at $T_{n+3}$ edge. As shown in FIG. 3, when the read latency is equated to a 'maximum value', the data captured from the memory module is available to the memory module only at the $T_{n+6}$ edge. The time interval between $T_{n+3}$ and $T_{n+6}$ is a variable timing window, within which the data might in fact have been available for reading had the 'maximum value' not been imposed on the memory module. In this case, even if the (captured) data was available between $T_{n+3}$ and $T_{n+6}$, the memory controller is compelled to wait until the time $T_{n+6}$ to read the data, since the read latency of the memory module has been calibrated only to a 'maximum value' but not to an 'optimum value'.

The prior art systems anticipate the read latency to be a 'minimum value' and a 'maximum value', so that the memory module is enabled to function under all possible conditions having an impact on the performance thereof. However, rendering the memory module to function under the premises set by the 'minimum value' and 'maximum value' is not considered as an effective and optimal solution, and therefore, in order to obviate the aforementioned drawback, the present disclosure envisages a method for automatically calibrating and optimizing the read latency of the memory module.

Figure 4:
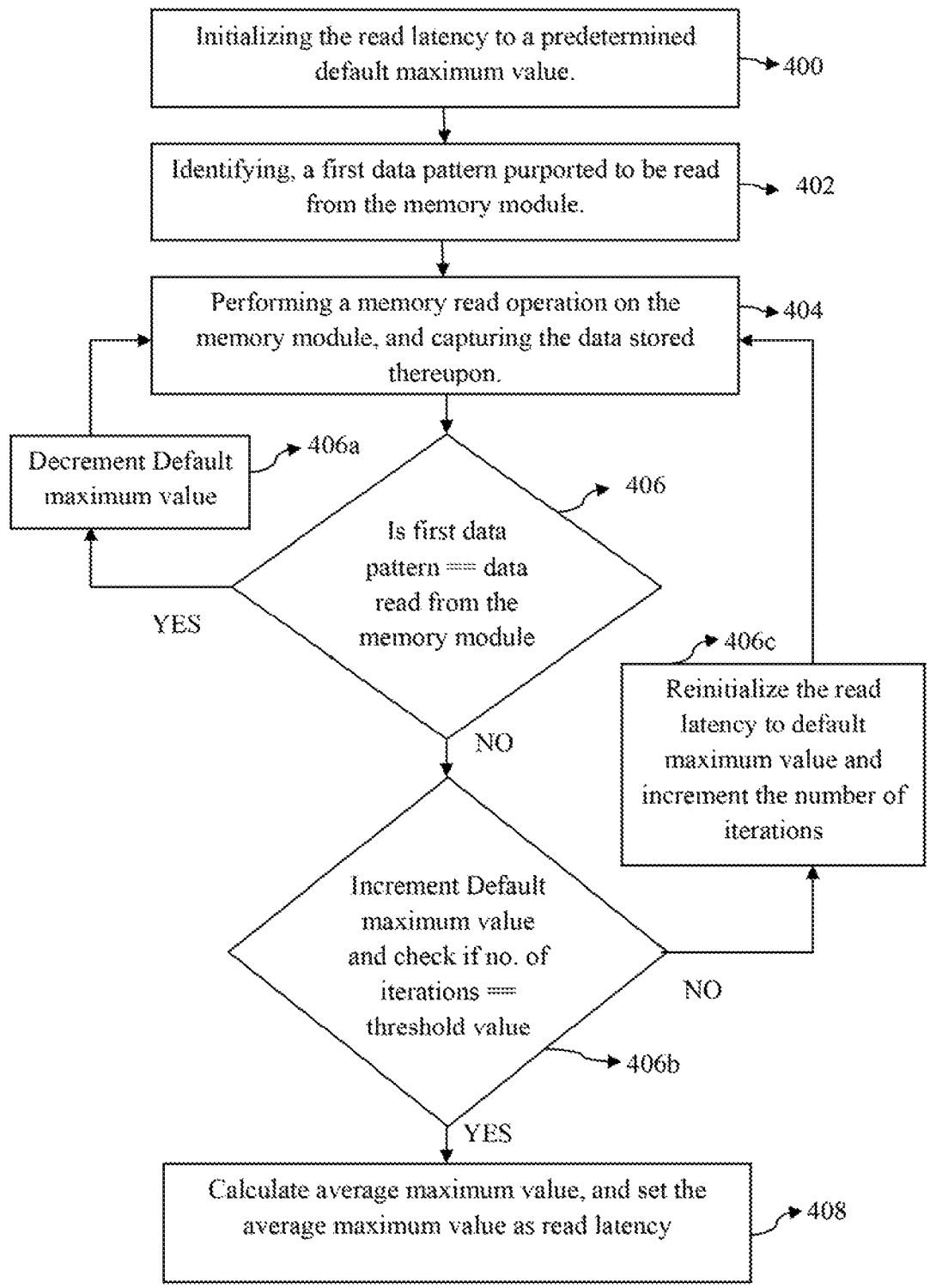
FIG. 4 is a flow chats illustrating the steps involved in a method far selectively calibrating read latency in a memory module.

In accordance with the present disclosure, the memory module is preferably a DDR DRAM module. Referring to FIG. 4, there is shown a flowchart illustrating the steps involved in the method for selectively calibrating read latency in the memory module. At step 400, the read latency of the memory module is initialized to a predetermined (default) maximum value. The read latency is assigned maximum possible value, taking into consideration the maximum possible delay (symbolizing a worst case scenario) in transfer of data read from the memory module. In this case, the read latency and in turn the maximum default value assigned to the read latency parameter denotes the maximum number of clock cycles after which a data signal is perfectly aligned with the data strobe signal. Further, the read latency and in turn the maximum default value assigned to the read latency is also indicative of the time delay between the moment when a memory controller instructs the memory module to fetch a particular data pattern, and the moment when the quested data pattern is available as an output from the memory module.

At step 402, the output of a memory read command issued in accordance with the said 'default maximum value' is identified. Typically, a memory read command (request) is issued to a predetermined memory bank of the memory module whose contents are determined beforehand (i.e., before the issuance of the memory read request). For example, the memory read command is issued to a DRAM MPR (Dynamic Random Access memory Multi Purpose Register) whose contents are known beforehand. In this case, since the contents of the DRAM MPR are known beforehand, a data pattern purported to be the output of the said memory read command is identified and categorized as the expected data pattern (referred to as 'first data pattern' hereafter).

At step 404, the memory read command is issued to the DRAM MPR (of the memory module) taking into consideration the 'maximum default value'. Subsequently, the data stored in the DRAM MPR is captured after the elapse of predetermined number of clock cycles represented by the said 'default maximum value'. At step 406, the 'first data pattern' is compared with the data read from the memory module (at step 404), and it is determined whether the 'first data pattern' is equivalent to the data pattern read from the memory module.

Further at the step 406, if the 'first data pattern' is determined to be equivalent the data pattern read from the memory module (at step 404), then the 'default maximum value' is decremented (step 406*a*) (typically by '1'), and the steps '404' and '406' are iteratively implemented until the 'first data pattern' is not equivalent to the data pattern read from the memory module. The phenomenon of the 'first data pattern' being not equivalent to the data pattern read from the memory module (at step 404) signifies that the set 'default maximum value' is less than the actual read latency of the memory module. Therefore, the 'default maximum value' is incremented (typically by '1') at step 406*b* only in the event that the 'first data pattern' is not equivalent to the data pattern read from the memory module. Further, at step 406*b*, it is determined whether the number of memory read operations is equivalent to a predetermined threshold value. If the number of memory read operations is determined not to be equivalent to the threshold value, then the read latency is reinitialized to the 'maximum default value' at step 406*c* and the steps '404' and '406' are iteratively implemented until the number of memory read operations is equivalent to the predetermined threshold value. When the number of iterations is determined to be equivalent to the threshold value, the execution of step '406' is terminated and execution of step '408' is initiated.

At step '408', the variations in the 'default maximum value' corresponding to each of the iterations of steps '404' and '406' are determined, and subsequently an 'average maximum value' is determined by adding up the 'default maximum value' of each of the iterations and dividing the resultant (of addition) by the threshold value. At step '410', the 'average maximum value' is set as the read latency of the memory module, and thereby the read latency of the memory module is calibrated.

Figure 5:
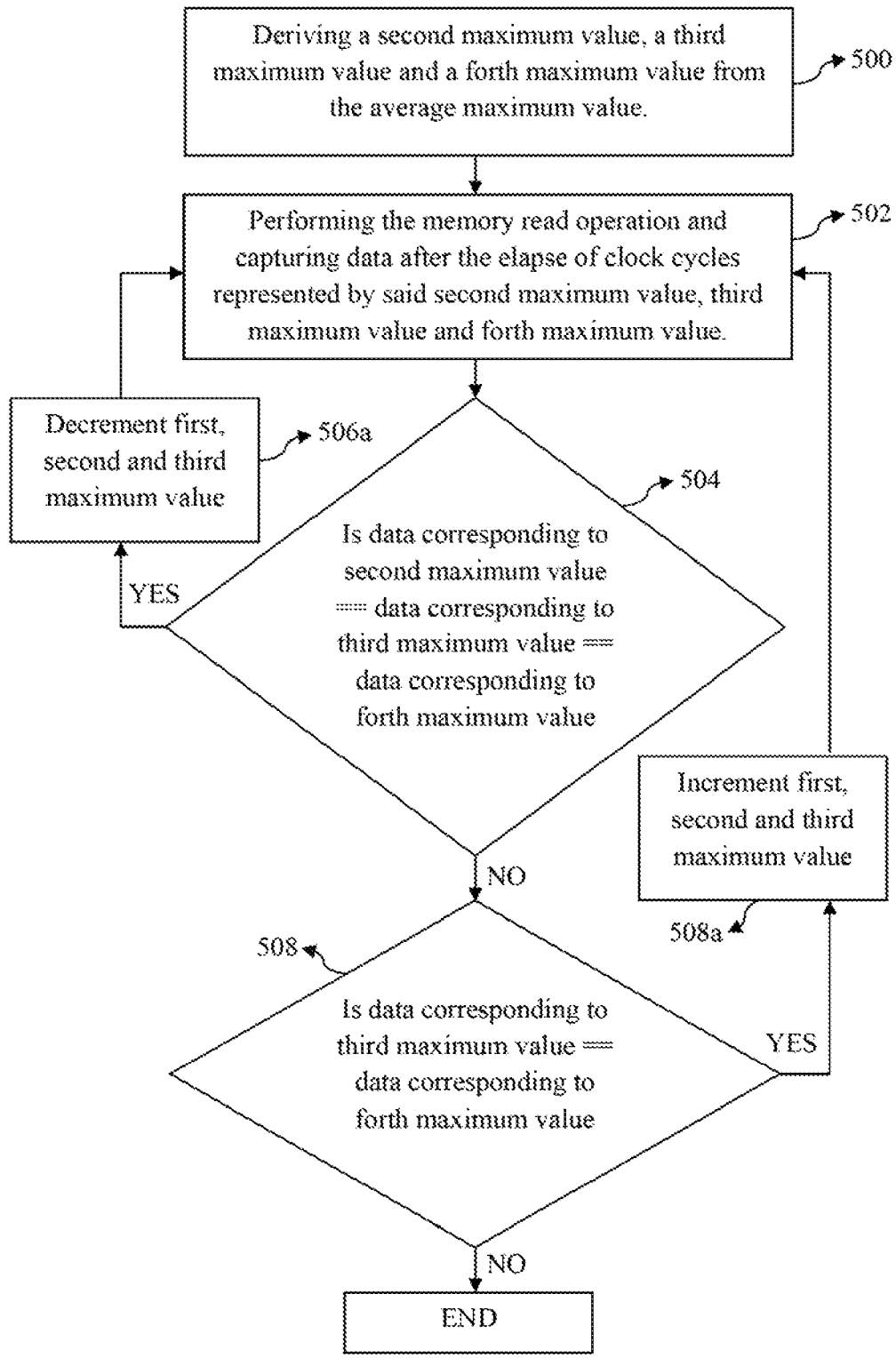
FIG. 5 is a flow chart illustrating the steps involved in a method for continuously recalibrating the read latency of the memory module.

Referring to FIG. 5, there is shown a flowchart illustrating the steps involved in a method for tracking and selectively recalibrating the read latency of the memory module. At step 500, at least 'three' instances of the 'average maximum value' are determined. The three instances of the 'average maximum value' are 'second maximum value', 'third maximum value' and 'forth maximum value' respectively.

In accordance with the present disclosure, the 'second maximum value' is derived by decrementing (typically by '1') the 'average maximum value'. Further, the 'third maximum value' is equivalent to the 'average maximum value'. Further, the 'forth maximum value' is derived by incrementing (typically by '1') the 'average maximum value'. In accordance with the present disclosure, the 'second maximum value', 'third maximum value' and 'forth maximum value' are arranged such that 'second maximum value'<'Third maximum value'<'Forth maximum value'.

In accordance with the present disclosure, at step 502, a memory read command is issued to the memory module, and the data is read there from (preferably from the same location of the DRAM MPR from which the data was read at step '404' described in FIG. 4). The data is captured from the memory read operation after the elapse of number of clock cycles represented by the 'second maximum value', 'third maximum value' and 'forth maximum value' respectively.

At step 504, the data read from the memory module subsequent to the expiry of clock cycles represented by the 'second maximum value' is compared with the data read from the memory module subsequent to the expiry of clock cycles represented by the 'third maximum value' and 'forth maximum value' respectively.

Subsequently, the values of 'second maximum value', 'third maximum value' and 'forth maximum value' are calibrated based on the comparison of the data read from the memory module subsequent to the expiry of clock cycles represented by the 'second maximum value', and the data read from the memory module subsequent to the expiry of clock cycles represented by the 'third maximum value' and 'forth maximum value'.

In accordance with the present disclosure, if at step '504', it is determined that the data read from the memory module subsequent to the expiry of clock cycles represented by the 'second maximum value' is equivalent to the data read from the memory module after the expiry of predetermined number of clock cycles represented by the 'third maximum value' and the 'forth maximum value' respectively, then at step '506a' the second maximum value, third maximum value and forth maximum value are iteratively decremented.

In accordance with the present disclosure, since the 'second maximum value' differs from 'third maximum value' by at least '−1', and since the 'forth maximum value' differs from the 'third maximum value' by at least '+1', if the data read from the memory module subsequent to the expiry of clock cycles represented by the three values respectively (i.e., second, third and forth maximum values) are equivalent to one another (step '504'), then it is determined that the read latency of the memory module is on a decrease (with respect to the 'maximum default value'), and therefore, the second maximum value, third maximum value and forth maximum value are iteratively decremented (step '506a') until the data (read from the memory module) corresponding to the 'second maximum value' differs from that of at least one of the 'third maximum value' and 'forth maximum value'. The execution of step 508 is initiated when at least one of the data (patterns) amongst the data read in accordance with the 'second maximum value', 'third maximum value' and 'forth maximum value' is deemed to be not equivalent to the other two data (patterns).

Subsequently, at step '508' if it is determined that the data read from the memory module subsequent to the expiry of clock cycles represented by the 'third maximum value' is equivalent to the data read from the memory module after the expiry of clock cycles represented by the 'forth maximum value' but not equivalent to the data read from the memory module after the expiry of clock cycles represented by the 'second maximum value' then at step '508a' the second maximum value, third maximum value and forth maximum value are iteratively incremented. The second maximum value, third maximum value and forth maximum value are incremented based on the assertion that the read latency of the memory module is on an increase (with respect to the 'maximum default value').

The read latency of the memory module is determined to be on an increase since the data read from the memory module after the expiry of clock cycles represented by the 'third maximum value' and 'forth maximum value' is equivalent, but the data read from memory module after the expiry of clock cycles represented by the 'second maximum value' is not equivalent to the data read after the expiry of clock cycles represented by the 'third maximum value' and 'forth maximum value'. The read latency is determined to be on an increase since the data read in accordance with 'second maximum value' (the second maximum value being lesser than both the 'third maximum value' and 'forth maximum value') does not match with the data read in accordance with 'third maximum value' and 'forth maximum value' (both 'third maximum value' and 'forth maximum value' greater than the 'second maximum value').

Further, at step 508, if it is determined that the data read from the memory module subsequent to the expiry of clock cycles represented by the 'second maximum value' is not equivalent to the data read from the memory module after the expiry of clock cycles represented by the 'third maximum value', and also not equivalent to the data read from the memory module subsequent to the expiry of clock cycles represented by the 'second maximum value', then the method is terminated, and the read latency is determined once again, based on the steps described in FIG. 4.

The technical advantages envisaged by the present disclosure include the realization of a system and method that automatically calibrates the read latency in a memory module. Further, the system and method provide for efficient compensation of voltage and temperature fluctuations of the SoC and memory module over a given time period. The system and method envisaged by the present disclosure takes into account the (memory) system drift, while calculating the corresponding read latency. The system and method provide for increased efficiency and accuracy in terms of calculation of the read latency corresponding to a memory module. Further, the system and method also forecasts an appropriate direction (upwards/downwards) in which read latency of the memory module is to be calibrated, and calculates an optimal read latency value corresponding to a memory module.

The foregoing description of the specific embodiments will so fully reveal the general nature of the embodiments herein that others can, by applying current knowledge, readily modify and/or adapt for various applications such embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, those skilled in the art will recognize that the embodiments herein can be practiced with modifications.

What is claimed is:

1. A method for selectively calibrating read latency in a memory module, said method comprising the following steps:
    initializing the read latency corresponding to the memory module to a default maximum value, wherein said default maximum value represents a predetermined number of clock cycles;
    identifying, based on said default maximum, value, a first data pattern purported to be read from the memory module in response to a memory read request;
    iteratively performing a memory read operation on a predetermined location of the memory module, and capturing the data stored thereupon, after elapse of predetermined number of clock cycles represented by said maximum value;
    iteratively comparing said first data pattern with the data read from the predetermined location of the memory module, and iteratively altering the default maximum value, based on the comparison between the first data pattern and the data read from said predetermined location;
    tracking alterations in said default maximum value over a predetermined number of iterations, and calculating an average maximum value based thereupon;
    calibrating the read latency by assigning said average maximum value as the read latency for the memory module;
    deriving at least three instances of said average maximum value, said three instances being a second maximum value, a third maximum value and a forth maximum value each of said second maximum value, third maximum value and forth maximum value representing clock cycles;
    performing the memory read operation on the predetermined location of the memory module and capturing data after the elapse f clock cycles represented by said second maximum value, third maximum value and forth maximum value respectively;
    comparing the data read from the memory module subsequent to the expiry of clock cycles represented by said second maximum value, with the data read from the memory module subsequent to the expiry of clock cycles represented by third maximum value and forth maximum value respectively;
    iteratively calibrating the second maximum value, third maximum value and forth maximum value based on a resultant of comparison of the data read from the memory module; and
    identifying at least the direction in which the read latency of the memory module is to be recalibrated.

2. The method as claimed in claim 1, wherein the step of tracking alterations in said default maximum value over a predetermined number of iterations, and calculating an average maximum value based thereupon, further includes the following steps:
    determining whether a redetermined number of memory read operations are performed; and
    calculating an average maximum value only after the predetermined number of memory read operations are performed.

3. The method as claimed in claim 1, wherein the step of iteratively altering the default maximum value based on the comparison between the first data pattern and the data read from said predetermined location, further includes the following steps:
    iteratively decrementing the default maximum value as long as the first data pattern is determined to be equivalent to the data read from said predetermined location of the memory module and iteratively performing the memory read operation; and
    iteratively incrementing the default maximum value in the event that the first data pattern is not equivalent to the data read from said predetermined location of the memory module, and until, the predetermined number of memory read operations are performed; and
    reinitializing the read latency to the default maximum value until the predetermined number of memory read operations are performed and iteratively performing the memory read operation.

4. The method as claimed in claim 1, wherein the step of iteratively performing a memory read operation on a predetermined location of the memory module further includes the step of iteratively performing a memory read operation on a DRAM MPR (Dynamic Random Access memory Multi Purpose Register) location.

5. The method as claimed in claim 1, wherein the step of deriving at least three instances of said, average maximum value, said three instances being a second maximum value, a third maximum value and a forth maximum value, further includes the following steps:
    deriving the second maximum value by decrementing said average maximum value;
    deriving the third maximum value as an equivalent of said average maximum value; and
    deriving the forth maximum value by incrementing said average maximum value.

6. The method as claimed in claim 1, wherein the step of comparing the data read from the memory module subsequent to the expiry of predetermined number of clock cycles represented by said second maximum value, with the data read from the memory module subsequent to the expiry of predetermined number of clock cycles represented by third maximum value and forth maximum value, further includes:
    determining whether the data read from the memory module subsequent to the expiry of predetermined number of clock cycles represented by said third maximum value, and the data read from the memory module after the expiry of predetermined number of clock cycles represented by said forth maximum value are equivalent to one another.

7. The method as claimed in claim 1, whether the step of iteratively calibrating the second maximum value, third maximum value and forth maximum value based on a resultant of comparison of said data, further includes the steps:
    iteratively decrementing the second maximum value, third maximum value and forth maximum value in the event that the data read from the memory, module after the expiry of predetermined number of clock cycles represented by said second maximum value is equivalent to the data read from the memory module after the expiry of predetermined number of clock cycles represented by said third maximum value and forth maximum value respectively, anti iteratively performing the memory read operation; and iteratively incrementing the second maximum value, third maximum value and forth maximum value in the event that the data read from the memory module after the expiry of predetermined number of clock cycles corresponding to said third maximum value and forth maximum value are equivalent to one another but the data read from the memory module after the expiry of predetermined number of clock cycles corresponding to said second maximum value is not equivalent thereto, and iteratively performing the memory read operation.

* * * * *